United States Patent [19]

Mayer

[11] 4,431,304
[45] Feb. 14, 1984

[54] APPARATUS FOR THE PROJECTION COPYING OF MASK PATTERNS ON A WORKPIECE

[76] Inventor: Herbert E. Mayer, Fallsgasse 486, FL-9492 Eschen, Austria

[21] Appl. No.: 324,976

[22] Filed: Nov. 25, 1981

[51] Int. Cl.³ .............................................. G03B 27/44
[52] U.S. Cl. ......................................... 355/54; 355/53
[58] Field of Search ............................. 355/72, 53, 54

[56] References Cited

U.S. PATENT DOCUMENTS

| | | | |
|---|---|---|---|
| 3,494,695 | 2/1970 | Sollima et al. | 355/53 |
| 3,569,718 | 3/1971 | Borner | 355/53 |
| 3,610,750 | 10/1971 | Lewis et al. | 355/53 |
| 3,617,125 | 11/1971 | Sobottke et al. | 355/53 |
| 3,950,095 | 4/1976 | Bouygues et al. | 355/53 |
| 4,189,230 | 2/1980 | Zasio | 355/53 |
| 4,345,836 | 8/1982 | Phillips | 355/53 |

Primary Examiner—Monroe H. Hayes
Attorney, Agent, or Firm—Karl F. Ross; Herbert Dubno

[57] ABSTRACT

An apparatus for the projection copying of patterns defined by masks on a workpiece, e.g. a semiconductor wafer coated with a photoresist in the production of integrated circuit units, comprises a stage with a cross-feed for positioning a wafer chuck in the X and Y direction in a horizontal wafer plane at which the projection beam is focused. According to the invention, the stage is supported on a base plate which, in turn, is mounted on three spaced-apart posts capable of infinitesimal vertical adjustment, guide surfaces or lines between the base plate and the structure on which it is supported having normals some of which intersect substantially in the wafer plane so that the axis of tilt, which can be generated by differentially adjusting the posts, is located substantially in the wafer plane.

10 Claims, 5 Drawing Figures

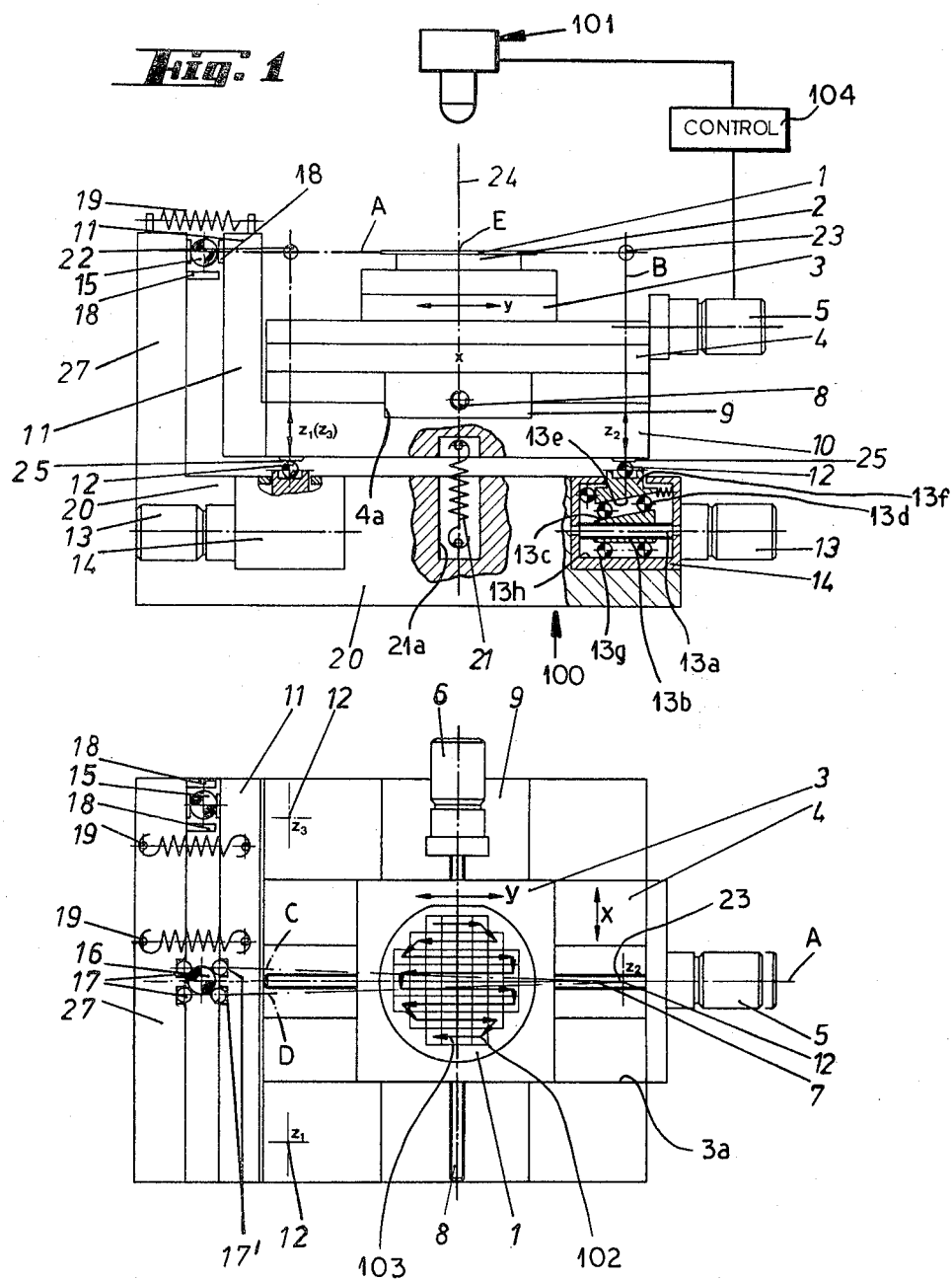

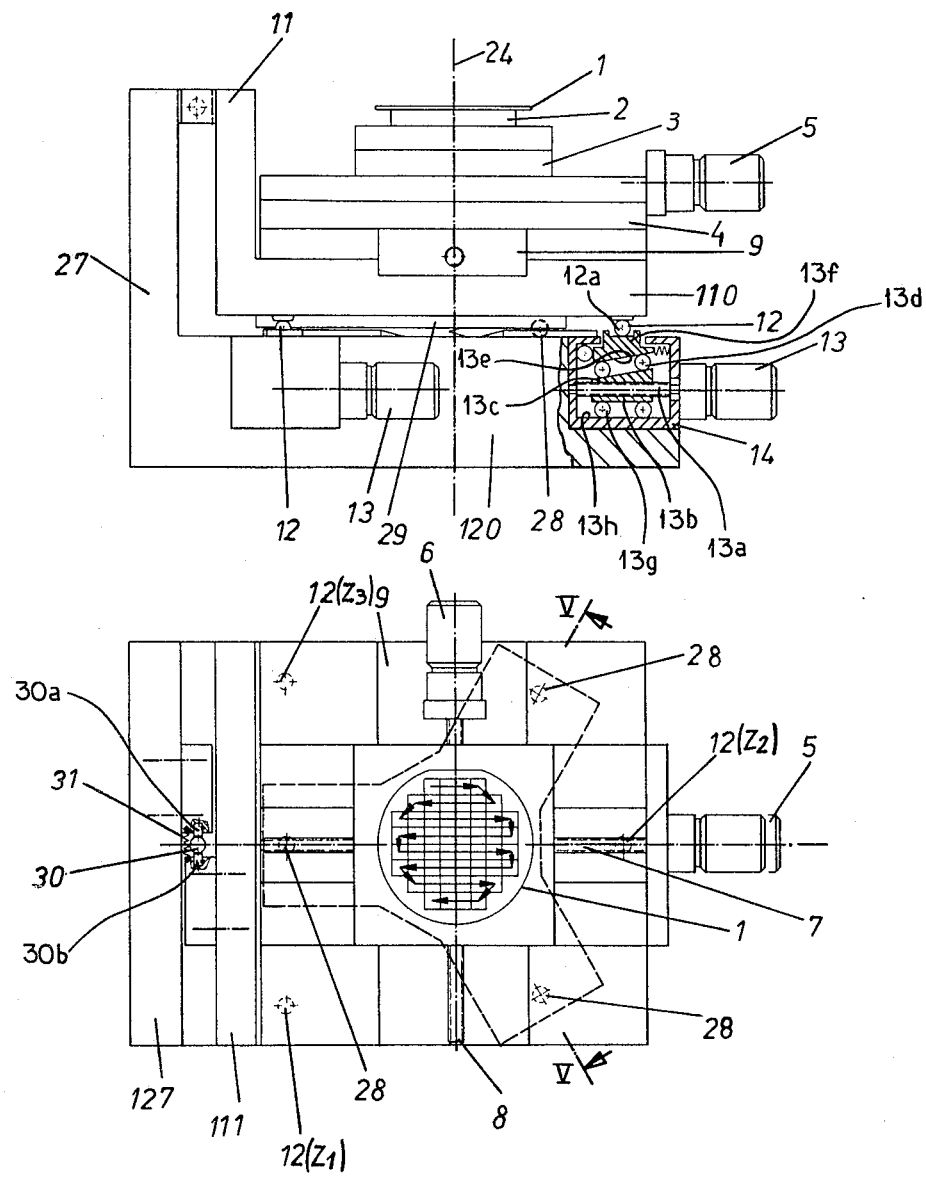

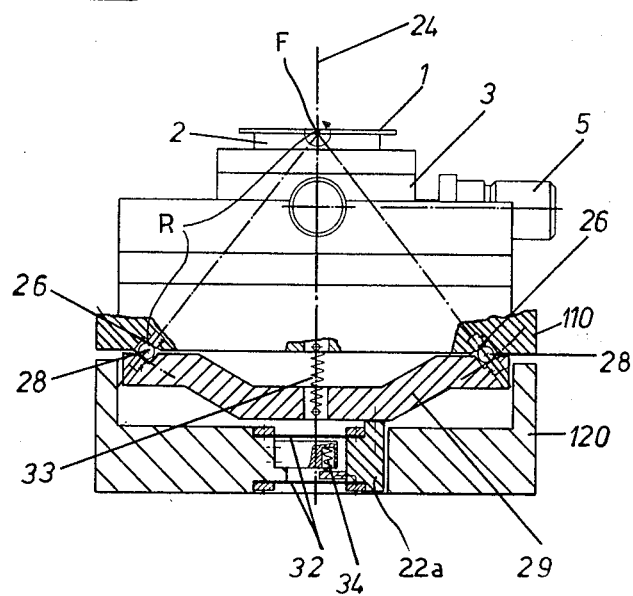

APPARATUS FOR THE PROJECTION COPYING OF MASK PATTERNS ON A WORKPIECE

CROSS-REFERENCE TO RELATED APPLICATIONS

The present application is related to the commonly assigned copending applications Ser. No. 188,539 filed September 18, 1980 by Herbert E. Mayer, entitled "METHOD AND DEVICE FOR THE PRINTING OF MASKS ONTO PLANAR WORKPIECES" (now abandoned), Ser. No. 197,991 filed October 10, 1980 entitled "PROCESS AND DEVICE FOR ALIGNING THE IMAGE AND/OR OBJECT SURFACES OF OPTICAL COPYING ARRANGEMENTS" by Herbert E. Mayer (replaced by FWC 476,299 on Mar. 18, 1983), Ser. No. 220,451 filed December 1980 by Herbert E. Mayer and entitled "METHOD OF AND APPARATUS FOR THE POSITIONING OF DISK-SHAPED WORKPIECES, PREFERABLY SEMICONDUCTOR WAFERS" (now U.S. Pat. No. 4,376,581), and Ser. No. 197,992 filed October 14, 1980 by Ernst Lobach entitled "PROCESS AND ARRANGEMENT FOR COPYING MASKS ON A WORKPIECE" (now U.S. Pat. No. 4,379,831). These prior applications, the references in the files thereof and the literature cited therein, as well as the publications cited below, constitute the best art currently known dealing with the subject of this invention.

FIELD OF THE INVENTION

The present invention relates to copying appratus of the type described in the aforementioned copending applications and, more particularly, to an apparatus for the sequential projection of patterns of a mask onto a workpiece and especially a workpiece in the form of a semiconductor wafer provided with a photosensitive layer, e.g., a photoresist. More particularly, the invention relates to a stage for supporting the workpiece for such copying, i.e., along the optical axis of a projection device.

The invention can also be considered to comprise a positioning unit adapted to be used in projection copying of the type described in the aforementioned copending applications for successively positioning regions of a planar workpiece, e.g., a semiconductor wafer, along the projection axis.

BACKGROUND OF THE INVENTION

In the projection of intergrated circuits it is common, as described in the aforementioned copending applications, to utilize a semiconductive wafer, e.g., a wafer cut from a zone-refined bar of silicon, to coat this wafer with a photosensitive layer, .e.g. a photoresist, and to expose this layer to a pattern which is reduced optically from a mask in a projection head.

Frequently, the pattern is projected onto successive regions of the wafer which is moved, more or less in the wafer plane, on a support stage provided with X and Y cross-slides for positioning each section in order along the optical axis.

Following exposure, the layer is developed and the developed layer constitutes a representation of the mask patterns and serves as a resist when the wafer is subjected to etching or further treatments, e.g. diffusion of materials into the wafer or transformation of the wafer structure in production of the semiconductor elements adapted to form the integrated circuit. The various chemical and physical treatments to which the resist-covered wafer may be exposed are well known in the art and require no elucidation here.

Since the mask which establishes the projection pattern which is to be generated in each region of the resist is itself generally an optical reduction from a master, it is apparent that high precision is required during the exposure or projection copying operation.

This high precision involves not only the optical or projection system and, as has been described in some of the aforementioned copending applications, the means for focusing the image onto the photoelectric layer or the means for positioning the wafer upon the support stage, but also the stage itself. In practice, the permissible tolerances in positioning the successive regions of the wafer along the optical axis are less than one micron and the photographic reduction in generating the image upon the wafer may be a factor of 10 as well.

In order to keep these tolerances and the requisite high precision, it has been found to be advantageous to project each image individually upon the respective region and hence to position each region in line with the optical axis after the image projection of a prior region generally contiguous to the region next exposed to the projection beam.

This is done, as alluded to earlier, by a stage capable of holding the wafer and having a cross-feed arrangement, i.e. a pair of carriages which are displaceable perpendicularly to one another so that one carriage can be displaced in a direction which, for convenience in defining coordinates, can be considered the X direction while the other carriage is displaceable in the Y direction, both mutually perpendicular directions being in the horizontal plane. Means is generally provided in the projection head of the apparatus to permit setting the focus at the wafer plane, i.e. for producing any necessary adjustment of the focal point in this plane in the vertical or Z direction.

The high precision can be obtained by controlling the X-Y cross-slide or stage using laser interferometric techniques.

However, even in such systems problems have been encountered with respect to the precise orientation of the upper surface of the wafer at the optical axis. It should immediately be apparent that high precision can only be obtained if the plane of this upper surface is normal to the optical axis.

In practice, however, the surface of the wafer may be irregular or irregularities may be formed in the layer of photosensitive materials applied to the wafer.

Thus, utilizing conventional devices, the plane of the region lined up with the optical axis frequently was not normal to this axis or truly perpendicular thereto and defective exposures resulted.

In European patent No. 27,570, therefore, a system has been proposed in which the chuck which retains the wafer, e.g. a vacuum chuck, was tiltable or pivotal about a fixed axis through the center of the wafer.

This represented a significant advance because at least at the center of the wafer, practically precise perpendicularity between the exposure plane and the optical axis could be ensured.

However, when large wafers were exposed along the periphery or at distances from the center of the wafer, difficulties were encountered, especially where intrinsic irregularities in the wafer surface were present.

Efforts to utilize the tiltability of the chuck to correct for lack of perpendicularity between the plane of the surface to be exposed on the optical axis resulted in shifting of the wafer or an incomplete compensation.

It will be appreciated that for maximum sharpness of the exposure, a global leveling of the surface by swinging the chuck about an axis at the center of the wafer is not sufficient.

With high resolving power optical systems (less than 1.5 microns) the depth of field is only about 2 microns. This depth of field can be taken up readily by irregularities in the substrate surface and in the thicknss of the photosensitive layer so that there is no depth of field reserved for compensating the bending or like irregularities of the wafer.

As a consequence, it is imperative that each image field for each exposure, i.e. each region of the wafer to be exposed, be individually leveled. This cannot be achieved utilizing a tilting system capable of tilting the chuck only about the center point of the wafer.

More specifically, when an effort is made to level each individual projection region of the wafer utilizing this single pivot point system of European Patent No. 27570, a tilt will result in an undesired shift in the Z (vertical direction), especially where this region is remote from the center of the wafer, requiring a renewed focusing action.

Still more disadvantageous is that the apparatus cannot adequately position the wafer plane so that it is perpendicular to the obstacle axis, nor can this be achieved rapidly utilizing the conventional device.

The system described in German open application No. 29 05 635 attempted to overcome the problem of leveling discrete regions of the wafer in the sense described above although this system is complex and practical realization of the means for carrying out the method is lacking in this disclosure.

Mention should also be made of the fact that it is known to level the wafer not only by movement of the chuck supporting the same, but also of the entire table or cross-slide arrangement (stage) utilized for shifting the wafer in the X and Y directions.

Such systems have generally required tilting about axes substantially offset from the wafer plane so that any leveling movement frequently resulted in undesired displacements of the wafer along other axes.

OBJECTS OF THE INVENTION

It is, therefore, the principal object of the present invention, to provide a projection copying apparatus for the purposes described which will overcome the disadvantages enumerated above.

Another object of the invention is to provide a system for leveling a semiconductive wafer or other workpiece whose successive regions are to be positioned at an optical axis for exposure to respective images, wherein the leveling can be effected with negligible or no shift normal to the optical axis.

Still another object of the invention is to provide a stage for a production-copying apparatus, especially for the successive exposures of a semiconductive wafer to mask images, which enables high precision positioning of each exposure region in a plane perpendicular to the optical axis.

Still another object of the invention is to provide an apparatus which can improve upon the leveling of a semiconductive wafer for the purposes described and which represents an improvement over the system described in Ser. No. 197,991 referred to earlier and hereby incorporated in its entirety by reference.

SUMMARY OF THE INVENTION

These objects and others which will become apparent hereinafter are attained, in accordance with the present invention, in an apparatus which comprises a workpiece holder, e.g. a semiconductive wafer engaging chuck, which is mounted upon a crossfeed table provided with means for displacing the chuck in an X and a Y horizontal direction, the table being provided with a base plate.

In addition this base plate is mounted on three spaced-apart posts on the support of the apparatus. The posts are capable of infinitesimal displacement of the respective points of attack of the posts upon the table, in the Z direction.

I have found that a workpiece support apparatus of the type described, preferably utilized as the stage of a projection-copying apparatus for positioning successive regions of the workpiece at an optical axis of a projection system whereby, for example, patterns defined by a projection mask are imaged upon the workpiece, e.g. the semiconductive wafer, can have a plurality of guide surfaces or lines for the base plate which have normals whose intersections or intersecting planes define a pivot axis for the base plate, upon differential operation of the posts, which lie substantially in the workpiece plane, i.e. the plane of the wafer and also constrains the base plate so that all movements normal to the optical axis are precluded.

More particularly, the tilting of the table, via the infinitesimal or incremental extension or contraction of the posts is defined by guide surfaces or lines for the base plate whose normals intersect at least approximately in the wafer plane so that the tilting is effected about an axis lying substantially in the wafer plane. Preferably this latter axis extends through the optical axis.

As a result of this constraint, the horizontal displacement of the wafer with each leveling of each individual imaging field or region is negligibly small, the tilting axis passing centrally through this field since it passes through the optical axis with which this field is aligned.

Of course, even though the tilt axis lies in the wafer plane, it is conceivable that it may be offset from the optical axis, in which case the tilting operation will result in some displacement in the Z direction which will require refocusing. This is avoided by insuring at all times that the tilt axis goes through the optical axis.

The latter can be ensured by appropriately synchronizing the displacement of the posts and/or by providing an additional constraint for the base plate. For example, the base plate can be provided with a tilt axis which intersects a normal from the guide surface or line of one of the posts substantially in the wafer plane and perpendicular to the optical axis. This or other means can prevent angular displacement of the base plate about an axis which does not intersect the optical axis.

In one embodiment of the invention, the guide surfaces are formed between balls carried by the posts and the base plate against which the balls ride, the guide surfaces being mutually parallel to one another. In this embodiment, the base plate is formed with an upstanding flange which is juxtaposed with an upstanding flange of the support and an additional guide is provided by forming each of the flanges with a pair of cylinders having vertical axis and receiving between tham a ball. Two of the cylinders are thus formed on the upstanding flange of the base plate and two of the cylinders on an upstanding flange of the support, and spring means is provided to draw the two flanges together. Another ball-type guide surface can be provided between the two flanges to prevent rotation of the base plate about the optical axis or an axis parallel thereto.

The first mentioned ball, of course, can permit vertical displacement of the base plate relative to the support and pivotal displacement about axis xis which intersects the optical axis.

According to another embodiment of the invention, between the base plate and the support, there is provided a further member for preventing translation of the workpiece in the wafer plane during the tilting movement. This latter member can have three angularly equispaced ball members bearing upon guide surfaces of the base plate and oriented so that the axes of these balls and the normals to these surfaces intersect at the center of the wafer and at the optical axis. This member is constrained to vertical movement only in the support, e.g. by a spring means, and the base plate can have a flange cooperating with a flange of the support, the two flanges having juxtaposed surfaces between which a ball is provided, preferably with its axis in the wafer plane, to prevent rotation of the wafer plane about the optical axis.

BRIEF DESCRIPTION OF THE DRAWING

The above and other objects, features and advantages of the present invention will become more readily apparent from the following description, reference being made to the accompanying drawing in which:

FIG. 1 is a diagrammatic vertical elevational view of a workpiece support apparatus embodying the invention, of which the projection head has been indicated only sketchily and with portions of the apparatus broken away;

FIG. 2 is a plan view of the stage of FIG. 1 also shown in highly diagrammatic form;

FIG. 3 is a view similar to FIG. 1 illustrating a second embodiment of the invention;

FIG. 4 is a plan view of this embodiment; and

FIG. 5 is a section generally taken along the line V-V of FIG. 4.

SPECIFIC DESCRIPTION

In FIGS. 1 and 2 of the drawing, I have shown a positioning stage 100 which cooperates with a projection head 101 for the copying of images of a master in this copying head onto a workpiece which can be a wafer 1 coated with a photosensitive material for the purposes described in the aforementioned copending applications and above. Projection heads for this purpose are shown in the copending applications and generally will comprise a support for a projection mask which is to be photographically reduced, a source of light, and an objective lens system having an optical axis 24 and focusible so that an image of the mask is cast upon the workpiece over, for example, a rectangular region 102 as shown in FIG. 2.

Each exposure corresponds to one such region and, as has been indicated by the arrows 103 in FIG. 2, the wafer is stepped past the optical axis in a pattern so that the successive regions 102 are exposed in the path indicated.

The exposure timing means, the means for orienting the semiconductor wafer upon the chuck of the stage, the focusing means and the means for establishing the pattern of exposure are all known in the art or are described in the aforementioned copending applications so that they do not require elucidation here. For the sake of completion, however, such control means is represented by the box 104 and the structure comprising the head 101, the stage 100 and the control 104, forms the copying machine of the invention.

Thus the purpose of the stage 100 is to position the wafer 1 in the image plane of the head 101, to incrementally displace this wafer so that each of the regions 102 is positioned in line with the optical axis 24, and the plane of the region 102 is tilted so as to be normal (perpendicular) to the optical axis as described previously.

The stage 100 comprises a vacuum chuck 2 which can be activated to grip and retain the wafer 1, previously coated with the photosensitive material, during the exposure operation.

The chuck 2 is mounted upon the carriage 3 of a cross-slide table 3, 4, capable of generating the X and Y movements in the horizontal plane for stepping the regions 102 into alignment with the optical axis along the path 103 previously mentioned.

More particularly, the chuck 2 is mounted upon the carriage 3 which is capable of movement along the Y-axis in a guide 3a formed in a table 4 which is shiftable in a guide 4a along the X-axis, perpendicular to the Y-axis.

Displacement of the chuck in the Y direction is effected by a stepping motor 5 which drives a threaded spindle or lead screw 7 engaged by a nut of the carriage 3.

Displacement in the X direction is effected by a motor 6 whose threaded spindle or lead screw 8 engages a nut carried by the slide 4. The guideway 4a is tilted for the levelling of the individual image regions of the wafer.

The base plate 10 is mounted on three posts which, as can be seen from FIG. 2, can lie at the vertices $Z_1$, $Z_2$, $Z_3$ of an isosceles triangle. The posts 14 each can be vertically extended and contracted for displacement in the Z direction by a respective motor 13. Each motor 13 drives a threaded spindle or lead screw 13a which is threadedly engaged by a wedge 13b having an inclined surface 13c bearing via rollers 13d against a countersurface 13e of a plunger 13f bearing via a ball 12 against the guide surface 12a on the underside of the plate 10. Support rollers 13g are disposed between the wedge 13b and the floor 13h of each hollow post.

Thus when the stepping motors 13 are operated, each wedge 13b can be stepped slightly to the left to lift the plunger 13f or to the right to lower the plunger 13f and thereby selectively extend or contract the post.

Force transmission to and from the plate 10 is effected via the balls 12 which allow, in engaging their guides 12a, free movement of the base plate 10 and the support 20 in which the posts are received in a horizontal direction.

A uniform operation of the motors 13 and hence a uniform extension or contraction of all of the posts synchronously and simultaneously, results in a vertical displacement of the base plate 10 parallel to itself. A tension spring 21 centrally anchored to the plate and to the support 20 and received in the well 21a maintains the plate 10 against the balls 12. When, however, the posts are differently extended, i.e. one is extended more than another or the others, the plate 10 is tilted relative to the horizontal and the wafer plane is likewise tilted.

The wafer, according to the invention, is levelled by the posts 14 which can be raised or lowered in the manner described.

For example, a lifting of the post 14 at the location $Z_2$ (FIG. 2) will tilt the base plate 10 about an axis defined by a line connecting the posts $Z_1$ and $Z_3$, i.e. an axis to the left of the optical axis as seen in FIG. 2, whereas a lifting of the two posts 12 at the locations $Z_1$ and $Z_3$, will tilt the base plate 10 about an axis parallel to this line and through the ball at the location $Z_2$.

By raising and lowering the posts, therefore, practically any tilt axis between these extremes can be achieved and, since the posts at locations $Z_1$ and $Z_3$ can also be differentially extended or retracted, the tilt axis can be established in any direction through the optical axis 24.

Furthermore, this axis can lie in the wafer plane.

Accordingly to the invention, horizontal shifting of the base plate 10 must be avoided so that the tilting action can be effected independently of the setting of the cross-slides 3, 4 and without interfering with the positioning of a particular region in line with the optical axis.

To this end, the base plate 10 is formed with an upstanding flange 11 which confronts but is spaced from a flange 27 on the support 20.

Between the flanges 11 and 27, a guide means is provided which allows vertical (Z-axis) movement of the plate 10 and tilting movements thereof parallel to the X- and Y-axes (i.e. movement with three degrees of freedom) but prevents translation parallel to the X- and Y-axes.

This guide means includes a pair of cylinders 17 which are parallel to one another and oriented so as to be parallel to the Z direction, i.e. vertically, upon the flange 27, and a pair of cylinders 17' which are mutually parallel, generally vertical and mounted upon the flange 11. A ball 16 is received between the four cylinders so that the swinging movement of the plate 10 is permissible about the axis A (FIGS. 1 and 2), an axis intersecting the optical axis 24 and extending through the center of the ball. Normals from the guide lines of contact between the ball and the cylinders 17' intersect along the optical axis 24 and define a horizontal plane at the level of the axis A of the ball which is intersected by a normal B to the guide surface 12 of the post at the location $Z_2$ to define a point 23 in the wafer plane. This intersection point 23 in the wafer plane is also the intersction of the normals C and D from the contact lines of the cylinder 17'. Point 23, therefore, is a line of effect for the post at the location $Z_2$.

Similarly, a normal to each guide surface of a ball 12 and two normals form guide lines of the cylinder 17' intersecting at a point such as is represented at 22, also in the wafer plane.

The effective tilting axis of the posts, therefore, will always be located in the wafer plane and, by proper adjustment of the differential displacement of the posts can always be made to pass through the optical axis.

Of course, the arrangement in FIGS. 1 and 2 thus far descried still admits of displacement in the wafer plane of the chuck about a vertical axis through the ball 16. To eliminate this degree of freedom while retaining all of the others already described, there is provided a further ball 15 between guide surfaces 18 as shown. Tension springs 19 are provided to retain the flange 11 against the balls 15 and 16 and the balls 15 and 16 against the flange 27. The centers of the balls 15 and 16, of course, have a common axis in the wafer plane parallel to the X-axis.

As each image field is brought into line with the optical axis 24, the surface orientation can be determined, e.g. by laser interferometry and the motors 13 driven accordingly to ensure that the particular image region is perpendicular to the axis 24.

It should be understood that this adjustment of tilt requires only slight modification from image field to image field since there is seldom a sharp change from one field to the next along the path of explosures. For example, the undulations on the surface of a wafer seldom have a variation of more than 5 microns/cm and in image fields of 1 cm$^2$, one scarcely need deal with deviations from planarity of more than 10 microns/cm of the path even in the most extreme cases. Such deviations correspond to a tilt angle of arc tg $10/10,000 = 0.057°$ or about 3.5 minutes of arc.

The unit 1–11 of FIGS. 1 and 2 can thus be considered to be a rigid body with three translatory and two angular degrees of freedom. The translatory degrees of freedom include freedom of translation of the wafer parallel to the X, Y, and Z-axes, and the rotary degrees of freedom include an angular displacement about the axis A and an angular displacement about an axis E perpendicular to the axis A. Angular rotation about the axis Z is precluded by the ball 15.

The system of FIGS. 1 and 2 is thus fully determined since all five balls individually permit movement with several degrees of freedom.

The embodiment of FIGS. 3 through 5 differs from that of FIGS. 1 and 2 in the relation between the support 120 and the base plate 110 and in the provision of other means for preventing rotation of the cross-slide about the Z axis.

As can be seen especially from FIG. 5, between the support 120 and the base plate 110, an intermediate plate 29 is provided which receives balls 28 bearing upon the inclined guide surfaces 26 on the underside of the base plate 110.

Since the guide surfaces 26 contact the respective balls 28 at three points along the imaginary surface of a sphere of radius R, the normals to these surfaces intersect it at the center point F of this sphere. This center point F coincides with the point at which the optical axis 24 intersects the wafer plane.

Consequently, operation of the posts 14 in the manner already described, will not cause translation in the wafer plane. However, if this plate 29 would be rigid with the support 20, the system would be overdetermined and could not operate. It is thus necessary to provide a degree of translatory movement parallel to the Z-axis and, to this end, the plate 29 is mounted on a support 29a which is suspended in a pair of leaf springs 32 for movement only parallel to the Z-axis, the weight of the plate 29 and the structure thereabove being taken up by the additional coil spring 34.

The system of FIGS. 3 through 5, of course, operates in the manner described except that it should be noted that any rotation about the Z-axis is here precluded by a ball 30 received between guides 30a and 30b carried by the flanges 111 and 127 and drawn together by a coil springs 31. This ball 30, of course, does not prevent the two rotary degrees of freedom already described in connection with the embodiment of FIGS. 1 and 2.

What is claimed is;

1. In an apparatus for the copying of patterns of a mask by projection of an image thereof along an optical axis upon a workpiece adapted to be displaced to dispose successive imaging regions in line with said axis, the improvement which comprises a workpiece stage having in combination:

A workpiece holder adapted to removably receive said workpiece and disposed generally along said optical axis;

a cross-feed table carrying said holder and operable for displacement thereof along X- and Y-axes for successively positioning said regions in alignment with said optical axis;

a base plate carrying said table;

a support below said table;

three extensible and contractible spaced-apart posts between said support and said base plate for differential adjustment generally parallel to a Z-axis for vertical displacement of said base plate and tilting thereof; and guide surfaces and lines between said posts and said base plate and constraining said base plate, said surfaces and lines having normals at least some of which intersect in a plane of said workpiece whereby variation in extension of posts tilts said workpiece about a pivot axis substantially in said plane to level the region aligned with said optical axis.

2. The improvement defined in claim 1 wherein said workpiece is a semiconductor wafer and said images are adapted to form patterns in a photosensitive layer applied to said wafer in said plane, said holder being a chuck receiving said wafer.

3. The improvement defined in claim 2 wherein said pivot axis intersects said optical axis.

4. The improvement defined in claim 2 wherein on the underside of said base plate three substantially parallel guide surfaces are provided which are also parallel to the plane of said wafer and are engaged by rolling bearings of said posts.

5. The improvement defined in claim 4 wherein said base plate and said support are provided with juxtaposed upright flanges, further comprising roller means between said flanges preventing rotation of said base plate about an axis parallel to said Z-axis.

6. The improvement defined in claim 5 wherein said roller means includes a ball received between pairs of cylinders fixed on each of said flanges, said flanges being spring-biased toward one another.

7. The improvement defined in claim 5, further comprising an additional roller means offset from said first roller means for preventing rotation of said plate about an axis of said ball parallel to said Z-axis.

8. The improvement defined in claim 5, further comprising three guide surfaces formed on the underside of said base plate and positioned to lie along an imaginary sphere having a center at the point of intersection of said optical axis with the plane of said wafer, and respective balls engaging the latter guide surfaces and carried by a support member, said support member being mounted for vertical movement on said support.

9. The improvement defined in claim 5 wherein each of said posts has a wedge member bearing via rollers upon a vertically displaceable member and driven by a threaded spindle.

10. The improvement defined in claim 9 wherein said support member is mounted on said support for vertical movement by leaf springs.

* * * * *

Dedication 4,431,304.—*Herbert E. Mayer*, Eschen, Austria. APPARATUS FOR THE PROJECTION COPYING OF MASK PATTERNS ON A WORKPIECE. Patent dated Feb. 14, 1984. Dedication filed Feb. 20, 1990, by the assignee, Mercotrust Aktiengesellschaft.

Hereby dedicates to the Public the remaining term of said patent.
[ *Official Gazette April 17, 1990* ]